United States Patent [19]

Brandt

[11] Patent Number: 4,571,557
[45] Date of Patent: Feb. 18, 1986

[54] WIDE BAND TRANSISTOR OSCILLATOR

[76] Inventor: Randy Brandt, 1607 Dressage, Orange, Calif. 92669

[21] Appl. No.: 593,524

[22] Filed: Mar. 26, 1984

[51] Int. Cl.⁴ .......................... H03R 5/18; H03C 3/28
[52] U.S. Cl. ....................................... 331/96; 331/99; 331/108 A; 331/117 R; 331/117 D; 332/16 T
[58] Field of Search .......... 331/96, 99, 108 R, 108 A, 331/113 R, 117 R, 117 D, 117 FE, 168; 332/16 T

[56] References Cited

U.S. PATENT DOCUMENTS

| | | | |
|---|---|---|---|
| 3,611,212 | 10/1971 | Ringelhaan et al. | 331/113 R X |
| 4,071,832 | 1/1978 | Cloke | 331/117 R |
| 4,346,351 | 8/1982 | Wilcox | 331/117 R |

OTHER PUBLICATIONS

Smith, D. T. "Long-Tailed Pair LC Oscillator" *Wireless World* Mar. 1970, p. 123.

Primary Examiner—Eugene R. LaRoche
Assistant Examiner—D. C. Mis
Attorney, Agent, or Firm—K. H. Boswell

[57] ABSTRACT

An oscillator includes two transistors or like devices having their emitters connected to a common of a power source. The two transistors or like devices are interconnected with the base of the first connected to the collector of the second and the base of the second connected to the collector of the first. An inductance is placed across the base-collector connectors and a circuit through the oscillator is completed via a lead to one of the base-collector connectors.

20 Claims, 5 Drawing Figures

U.S. Patent     Feb. 18, 1986     4,571,557
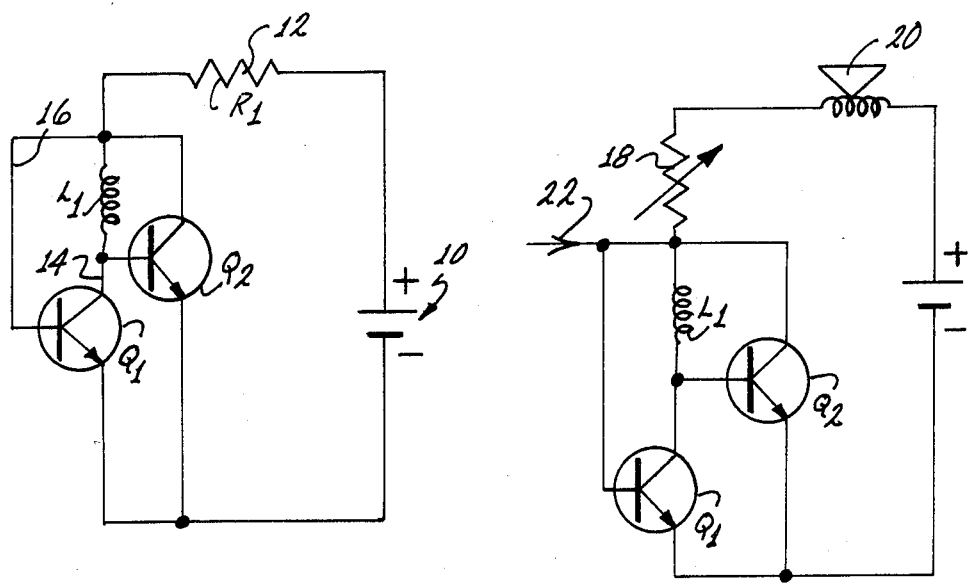
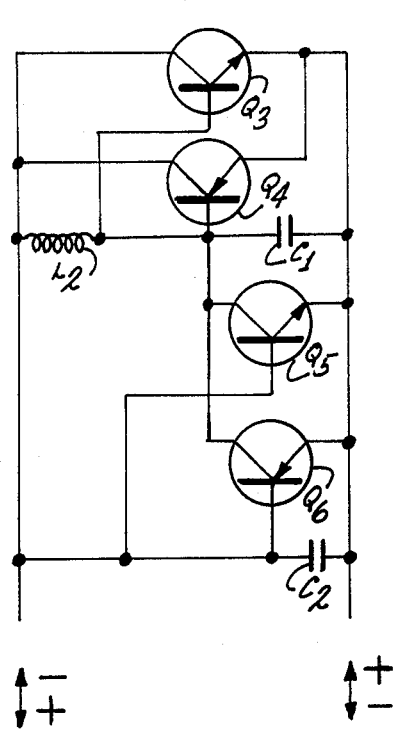
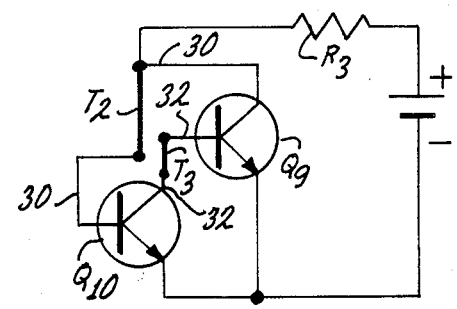
Fig.4a
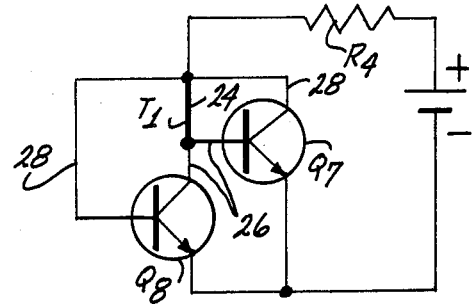
Fig.4b

WIDE BAND TRANSISTOR OSCILLATOR

BACKGROUND OF INVENTION

This invention relates to an oscillator capable of being utilized so as to output a wide band of frequencies. The oscillator of the invention incorporates a first and a second electronic valve element such as a transistor, coupled in a circuit with an inductor and a power source.

Tunable electronic oscillators are well known. Such oscillators output signals which are capable of being utilized to transmit information over a continuous band of frequencies. These techniques are described in various texts, for example in F. E. Termens *Handbook for Electrical and Electronic Engineers*, McGraw Hill. Various circuits have been proposed for transmitting information by using tunable electronic oscillator frequency signals. One such circuit uses a varactor diode to vary the frequency in either a Colpitts, Hartley, Clapp or a crystal tunable oscillator.

As electronic circuits have become more complex and as the use of IC's has increased, it has become desirable and necessary to reduce the volume, power consumption and number of components of the oscillators.

BRIEF DESCRIPTION OF INVENTION

In view of the above, it is a broad object of this invention to provide an oscillator which includes a brevity of parts. It is a further object of this invention to provide an oscillator which, because of its versatility is capable of being utilized in a variety of different component circuits. It is a further object to provide an oscillator having a wide frequency range so as to be adaptable for utilization in a variety of electronic circuits.

These and other objects, as will become evident from the remainder of this specification are achieved in an electronic oscillator which comprises: a first and a second electrical control means, each of said electrical control means including a current emitting functionality, a current control functionality and a current collecting functionality, each of said electrical control means exhibiting the property of a space charge effect between said current emitting functionality and said current control functionality and the property of a transconductance effect between said current controlling functionality and said current collecting functionality; a first electrical connector between the current controlling functionality of said first electrical control means and the current collecting functionality of said second electrical control means; a second electrical connector between the current controlling functionality of said second electrical control means and the current collecting functionality of said first electrical control means; an induction means associated between said first and said second electrical connectors; a first lead means connecting to the current emitting functionality of both said first and said second electrical control means; a second lead means connecting to one of said first and said second electrical connectors; a power source means for supplying a current, said power source means in operative electrical association with said first and said second lead means.

In one embodiment of the invention the inductor means would comprise a shunt means such as an inductor or a one quarter wave length transmission line and would be connected in the circuit electrically between the first electrical connection and the second electrical connection. In a further embodiment of the invention, the inductor means would comprise a pair of transmission lines which, in one manner or the other, would be nonequivalent such that they had different inductive properties with the net difference in these inductive properties being fed into the circuit between the first and second electrical control means. For most applications of the oscillator of this invention, the first and second electrical control means would comprise transistors having a common power source at their emitters with the collector of one of the transistors connected to the base of the other and the collector of the other connected to the base of the one.

BRIEF DESCRIPTION OF THE DRAWINGS

This invention will be better understood when taken in conjunction with the drawings wherein:

FIG. 1 is a schematic showing the basic oscillator of the invention;

FIG. 2 is a schematic of an FM transmitter utilizing the oscillator of FIG. 1;

FIG. 3 is a schematic of a non-polar embodiment of the oscillator of the invention;

FIG. 4a is an embodiment of the oscillator of this invention utilizing first and second transmission lines in lieu of the inductor shown in FIG. 1; and FIG. 4b is a further embodiment utilizing a single transmission line as a substitute for the inductor of FIG. 1.

This invention utilizes certain principles and/or concepts as are set forth in the claims appended to this specification. Those skilled in the electronic arts will realize that these principles and/or concepts are capable of being utilized in a variety of embodiments which may differ from the exact embodiments utilized for illustrative purposes herein. For this reason, this invention is not to be construed as being limited only to the illustrative embodiments, but is only to be construed as being limited by the claims.

DETAILED DESCRIPTION OF THE INVENTION

The oscillator of this invention has as its basis a first and second electrical control or electrical valve, for which examples will be given below, which are coupled together in a particular configuration and which further includes a further component capable of introducing an inductive effect into certain points of the circuitry connecting these electrical control elements. Suitable as the electrical control elements would be bipolar transistors, MOS transistors, field effect transistors (FET's) and even electronic tubes.

The introduction of the variety of solid state devices which include transistors and the like has led to the demise of most vacuum tubes with the exception of large power tubes. Such large power tubes could be utilized in an oscillator circuit as per the invention to produce extremely powerful signals oscillating at frequencies governed by the device.

All of the above electrical control elements include a cathode, emitter, source or the like, serving as a current emitting functionality. They further include a grid, base, gate or the like serving as a current control functionality and a anode, collector, drain or the like serving as a current collecting functionality. The electrical control elements further all have the property of a space charge present between the emitter and the base or their like equivalents as well as the property of transconductance between the base and the collector or their like equivalents.

In conjunction with the inductance means discussed below, the presence of the transconductance and space charge allows for tuning of the oscillator. By decreasing or increasing the residual time of the space charge by using known techniques such as the decrease of the space charge upon doping with gold in bipolar transistors, the frequency of operation of the oscillator can be modified.

Further, by changing the inductance of the inductance means as described below, the frequency of operation of the oscillator can also be changed. This same effect can be achieved by current changes, as for instance, the input current to the emitter of bipolar transistors, to modify the transconductance of the device, and thus modifying the frequency of operation of the oscillator.

Depending upon the component selected for the electrical control means, and for the inductor means, as well as the power supplied to the oscillator, the oscillator is capable of being utilized over a very wide frequency band from sub-audio ranges into at least the gigahertz range and possibly beyond. In a typical example, as described with regard to FIG. 2 below, a particular frequency range can be chosen, as for instance, the FM broadcast range, with the oscillator then operating over a particular selected band width.

In one embodiment of the invention, when devices such as bipolar transistors are utilized for the electrical control means the emitters will be connected to ground. In a further embodiment of the invention, a nonpolar operation can be achieved, such that it matters not what the polarity of the circuitry is.

In this embodiment, the oscillator of the invention operates much like a crystal oscillator and can be utilized as a substitution of such oscillators in devices wherein these oscillators are used. The oscillator of the invention, as such, can be utilized in applications wherein the polarity of the power source is set, or in other applications wherein the polarity of the power source does not matter.

The induction means of the oscillator of the invention can be any one of a variety of standard inductors such as chokes, solenoidal inductors, toroidal inductors, coaxial cables, wave guides and transmission lines. In typical applications as per the embodiments described herein, chokes and transmission lines are utilized to appropriately provide an inductance across the two electronic control means.

The output frequency of operation of the oscillator of the invention can be tuned to a particular frequency by setting the value of the inductance which is supplied across the two electrical control means. By varying the inductance, such as increasing the inductance, the frequency of operation of the oscillator will be decreased. As the inductance is decreased, the frequency of the oscillator increases. By correlating the choice of the value of the inductor with the space charge of the electrical control means in conjunction with the power input to the electrical control means, as noted above, frequency ranges from sub-audio below 1 Hz to frequencies of 40 gigahertz and beyond, can be achieved. Power levels can vary from very high currents for large power tubes and the like to extremely small currents utilized to achieve oscillatory frequencies in the upper range of the frequencies of the device.

The oscillator can be so constructed so as to output a variable frequency by varying one of the frequency dependent parameters noted above. One of the most convenient ways of modulating the frequency of operation is to modulate the current supplied to the electrical control means of the device. For any particular voltage applied to the electrical control means, a variable load in circuit with the oscillator of the invention can serve to modulate the current supplied to the oscillator of the invention so as to modulate its frequency. Thus, for operation of the device, so as to output variable frequencies, variable resistors or other similar devices such as microphones or the like, can be placed in the circuit with the oscillator of the invention. In this manner, extremely simple devices can be built based upon utilization of the oscillator of the invention. As for instance, an extremely simple FM transmitter can be built as is described below with respect to FIG. 2 utilizing only a handful of components.

In other instances, a variable current can be supplied to the electrical control means of the invention utilizing other devices such as a constant current source in conjunction with a modulated input voltage added to the constant power source across a resistance. It is evident that the oscillator of the invention can be varied with respect to the components incorporated into its circuitry so as to achieve a variety of uses. It is further evident that the oscillator of the invention could be built on a monolithic IC allowing for incorporation of the oscillator into the microcircuitry of an IC based device. Because of the frequency control achievable because of (a) the geometry and/or construction of the components, (b) the current variability, and (c) the inductance variability, a broad range of frequencies achievable with the oscillator of the invention which lends its use to a broad variety of applications.

Referring now to the Figs., in FIG. 1, a battery 10 in circuit with a resistor 12 is utilized to provide a current for two bipolar transistors Q1 and Q2. The transistors Q1 and Q2 and NPN types, having their emitters commonly ground to the battery 10. A first electrical connector 14 ties the collector of Q1 to the base of Q2. A second electrical connector 16 ties the collector of Q2 to the base of Q1. An inductor L1 is electrically connected across the first and second electrical connectors 14 and 16. The inductor L1 in essence shunts across these two connectors so as to introduce an inductance across the collector and base of the respective bipolar transistors Q1 and Q2. A circuit is completed from the battery 10 through the resistor 12 to one or the other of the first electrical connectors such as connector 16 in FIG. 1. The frequency of oscillation of the oscillator shown in FIG. 1 will be dependent upon the voltage of the battery 10, the resistance value of the resistor 12, the inductance value of the inductor L1 as well as the inherent properties of the bipolar transistors chosen for Q1 and Q2.

In FIG. 2, the oscillator of FIG. 1 is utilized to modulate a small FM broadcast band transmitter. This is achieved by incorporating a variable potentiometer 18 and a microphone 20 in place of the resistor 12 and by further including an antenna 22 connected to one or the other of the first or second electrical connectors connecting the two bipolar transistors Q1 and Q2. The FM transmitter is tuned to an appropriate frequency band width such as that between 80 MHz and 110 MHz via the potentiometer 18. The variable load introduced by the microphone 20 upon reception of sound by the microphone 20 then broadcasts an FM modulated signal from the antenna 22. Utilizing a voltage source such as a one and one half volt battery, the FM transmitter is capable of transmitting a signal which can be received by a suitable FM receiver within an appropriate distance for signalling, amusement, short range communication and the like.

Aside from the FM transmitter shown in FIG. 2, it will be evident that the oscillator of the invention can be built utilizing readily available electronic components for use in other devices such as hearing aids, telephones, computer clocks, receivers and the like.

In FIG. 3, an embodiment of the oscillator of the invention is shown which is applicable for use in those situations wherein the polarity of the current source either does not matter or is reversible. Essentially, the oscillator of FIG. 3 differs from that of FIG. 1 only in that two PNP bipolar transistors have been added to the circuit, with one of the PNP bipolar transistors being placed in parallel with each of the NPN transistors. In comparing the two circuits, Q3 of FIG. 3 would be equivalent to Q2 of FIG. 1 with Q5 of FIG. 3 equivalent to Q1 of FIG. 1. Q4, a PNP transistor, has been added in parallel with Q3 and Q6, also a PNP transistor, has been added in parallel with Q5.

In order to improve the stability of the oscillator shown in FIG. 3 and to inhibit harmonic distortion and the like, the two capacitors C1 and C2 can be added across the respective bases and emitters of the transistor sets Q3, Q4 and Q5 and Q6, respectively. The oscillator of FIG. 3 does not require the presence of the capacitors C1 and C2 in its circuitry in order to function; however, the stability of the signal is increased by so including the capacitors into the circuitry.

The bases of Q3 and Q4 are common, as are the collectors of Q3 and Q4. Further, the bases of Q5 and Q6 are common and so are their collectors. An appropriate inductor L2 is located across the common leads between the bases of Q3 and Q4 and the collectors of Q5 and Q6 and the bases of Q5 and Q6 and the collectors of Q3 and Q4, respectively.

The oscillators of FIGS. 1 through 3 have all included an inductor electrically connected across the first and second electrical connectors between the bipolar transistors or groups of bipolar transistors shown in the Figs. As a substitute for the inductors L1 and L2 shown in FIGS. 1 through 3, a transmission line T1 identified by the numeral 24 in FIG. 4b, can be electrically connected across the first and second electrical connectors 26 and 28 respectively of the circuit of FIG. 4b. Anything serving as at least a one fourth wave transmission line will be suitable for use for the transmission line 24. As such, a simple hard wire, a printed circuit connector or the like which will produce a magnetic field upon passing a current through the same, with the magnetic field then arising and collapsing in response to current changes through the same, will be suitable for the transmission line 24. Other transmission lines, such as a half wave transmission line or the like, would also be suitable.

In FIG. 4a a direct electrical connection between the first electrical connector 30 and the second electrical connector 32 connecting Q9 and Q10 is not utilized. Instead, two transmission lines, T2 and T3, are incorporated. Transmission line T2 is included in the connection between the collector of Q9 and the base of Q10 and transmission line T3 is included in the connection between the collector of Q10 and the base of Q9. For the purposes of the schematic of FIG. 4, the transmission lines T1, T2 and T3 are shown in heavy lines. In actual practice, the transmission lines T2 and T3 could, in fact, simply be a portion of the first and second electrical connectors 30 and 32 shown in that Fig. For FIG. 4, Q7, Q8, Q9, Q10 and R2 and R3 are as previously described.

The transmission lines T2 and T3 are asymmetrical, or not equivalent, with regard to at least one factor which will change or modify the absolute inductance of T2 with respect to T3. Because of this, the inductance of T2 is different from T3 and as such there is a net difference in the inductance between the two transmission lines T2 and T3, with this net difference then serving the same function as the transmission line T1 in FIG. 4b or the inductors L1 or L2 in FIGS. 1, 2 and 3.

The transmission lines T2 and T3 differ with respect to one another with regard to some parameter which contributes to their inductance. This could be the length wherein as shown in FIG. 4a transmission line T2 is of a greater length than transmission line T3. A further way of changing their absolute inductance would be by modifying their cross sectional geometry such that, for instance, one of the inductors is of a greater diameter than the other of the inductors. An additional method would be by the use of dissimilar materials, as for instance, utilizing aluminum for one of the inductors and copper for the other, such that the inductance would also differ because of the materials. Further, the dielectric properties of an insulator utilized to cover the inductor might be different such that boundary layer (skin effect) characteristics of the two transmission lines are different. Other methods, as will be suggested to the art skilled could also be utilized so as to render the inductance of the two transmission lines T2 and T3 different from one another. In any event, each of the transmission lines T2 and T3, as per the transmission line T1, would at minimum constitute a one fourth wave transmission line.

If length of the transmission line T2 with respect to T3 is chosen as the parameter to achieve the difference of induction between the two lines, a simple construction expedient is to make the connector between the base of one of the transistors to the collector of the other of the longer length of wire than the connector between the collector of the one transistor and the base of the other.

I claim:
1. An electronic oscillator which comprises:
   a first and a second electrical control means, each of said electrical control means including a current emitting functionality, a current control functionality and a current collecting functionality, each of said electrical control means exhibiting the property of a space charge effect between said current emitting functionality and said current control functionality and the property of a transconductance effect between said current controlling functionality and said current collecting functionality;
   a first electrical connector between the current controlling functionality of said first electrical control means and the current collecting functionality of said second electrical control means;
   a second electrical connector between the current controlling functionality of said second electrical control means and the current collecting functionality of said first electrical control means;

an induction means associated between said first and said second electrical connectors;

a first lead means connecting to the current emitting functionality of both said first and said second electrical control means;

a second lead means connecting to one of said first and said second electrical connectors;

a power source means for supplying power, said power source means in operative electrical association with said first and said second lead means; and wherein the space charge between said current emitting functionalities and said current control functionalities of said first and said second electrical control means constitutes the dominant capacitance of said oscillator whereby the frequency of oscillation of the oscillator is determined by the combination of the inductance of said inductor means, the space charge of said first and said second electrical control means and the current supplied by said power source means.

2. The oscillator of claim 1 wherein:

said inductor means comprises a shunt means electrically connected between said first and said second electrical connectors.

3. The oscillator of claim 2 wherein:

said induction means comprises an inductor.

4. The oscillator of claim 1 wherein:

said power source means connected by said first lead means to said current emitting functionality of both said first and said second electrical control means and a load means connected by said second lead means to one of said first and said second electrical connectors.

5. An electronic oscillator which comprises:

a first and a second electrical control means, each of said electrical control means including a current emitting functionality, a current control functionality and a current collecting functionality, each of said electrical control means exhibiting the property of a space charge effect between said current emitting functionality and said current control functionality and the property of a transconductance effect between said current controlling functionality and said current collecting functionality;

a first electrical connector between the current controlling functionality of said first electrical control means and the current collecting functionality of said second electrical control means;

a second electrical connector between the current controlling functionality of said second electrical control means and the current collecting functionality of said first electrical control means;

an induction means associated between said first and said second electrical connectors;

a first lead means connecting to the current emitting functionality of both said first and said second electrical control means;

a second lead means connecting to one of said first and said second electrical connectors;

a power source means for supplying power, said power source means in operative electrical association with said first and said second lead means; and wherein said power source means comprises a means for inputting a variable current to said current emitting functionalities of said first and said second electrical control means whereby the frequency of oscillation of said oscillator is determined by the combination of the inductance of said inductor means, the space charge of said first and said second electrical control means and the current supplied by said power source means.

6. The oscillator of claim 1 wherein:

said power source means includes a variable resistance means.

7. The oscillator of claim 1 wherein:

each of said first and said second electrical control means comprises transistor means.

8. The oscillator of claim 1 wherein:

each of said first and said second electrical control means comprises vacuum tube means.

9. The oscillator of claim 7 wherein:

each of said first and said second electrical control means comprises metal oxide semiconductor means.

10. The oscillator of claim 7 wherein:

each of said first and said second electrical control means comprises junction-gate field-effect transistor means.

11. The oscillator of claim 7 wherein:

each of said first and said second electrical control means comprises bipolar transistor means.

12. An electronic oscillator which comprises:

a first and a second electrical control means, each of said electrical control means including a current emitting functionality, a current control functionality and a current collecting functionality, each of said electrical control means exhibiting the property of a space charge effect between said current emitting functionality and said current control functionality and the property of a transconductance effect between said current controlling functionality and said current collecting functionality;

a first electrical connector between the current controlling functionality of said first electrical control means and the current collecting functionality of said second electrical control means;

a second electrical connector between the current controlling functionality of said second electrical control means and the current collecting functionality of said first electrical control means;

an induction means associated between said first and said second electrical connectors;

a first lead means connecting to the current emitting functionality of both said first and said second electrical control means;

a second lead means connecting to one of said first and said second electrical connectors;

a power source means for supplying power, said power source means in operative electrical association with said first and said second lead means; and wherein each of said first and said second electrical control means includes an NPN and a PNP transistor wired in parallel with their respective collectors connected together, their respective emitters connected together, and their respective based connected together whereby the frequency of oscillation of said oscillator is determined by the combination of the inductance of said inductor means, the capacitance between the base and emitters of each of said transistors and the current supplied by said power source means.

13. The oscillator of claim 2 wherein:

said shunt means comprises an electrical connector which functions as at least a quarter wave transmission line.

14. The oscillator of claim 1 wherein:

said inductor means comprises said first electrical connector being a first transmission line and said second electrical connector being a second transmission line and said first transmission line is dissimilar with respect to said second transmission line.

15. The oscillator of claim 14 wherein:
said first transmission line is dissimilar to said second transmission line with respect to at least one of their respective lengths, cross sections, materials and insulators.

16. The oscillator of claim 5 wherein:
said means for inputting a variable current includes a variable resistance means.

17. The oscillator of claim 5 wherein:
said inductor means comprises a shunt means electrically connected between said first and said second electrical connector.

18. The oscillator of claim 5 wherein:
said inductor means comprises said first electrical connector being a first transmission line and said second electrical connector being a second transmission line and said first transmission line is dissimilar with respect to said second transmission line.

19. An FM transmitter which comprises:
a first and a second transistor;
a power source means for supplying a current;
a first transistor connector connecting the collector of one of said transistors to the base of the other of said transistors;
a second transistor connector connecting the base of said one of said transistors to the collector of said other of said transistors;
an inductance means electrically connected across said first and said second transistor connectors;
an antenna means electrically connected to one of said first and said second transistor connectors;
a variable load means having a first and second electrical lead, one of said electrical leads connecting to said first and said second transistor connector to which said antenna means is electrically connected; and
said power source means connecting between the other of said electrical leads of said variable load and the emitters of both of said transistors.

20. The transmitter of claim 19 wherein:
said variable load means includes variable resistance means.

* * * * *